United States Patent
Lin et al.

(10) Patent No.: US 7,349,237 B2
(45) Date of Patent: Mar. 25, 2008

(54) PLATELINE DRIVER WITH RAMP RATE CONTROL

(75) Inventors: Sung-Wei Lin, Plano, TX (US); Sudhir K. Madan, Richardson, TX (US); John Fong, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 27 days.

(21) Appl. No.: 11/003,707

(22) Filed: Dec. 3, 2004

(65) Prior Publication Data

US 2005/0078504 A1  Apr. 14, 2005

Related U.S. Application Data

(63) Continuation-in-part of application No. 10/866,834, filed on Jun. 14, 2004, and a continuation-in-part of application No. 10/614,299, filed on Jul. 2, 2003, now Pat. No. 6,809,954.

(51) Int. Cl.
*G11C 11/00* (2006.01)
*G11C 5/14* (2006.01)

(52) U.S. Cl. .................. 365/145; 365/149; 365/226

(58) Field of Classification Search ............... 365/145, 365/149, 226
See application file for complete search history.

(56) References Cited

U.S. PATENT DOCUMENTS

| | | | | |
|---|---|---|---|---|
| 5,978,251 A * | 11/1999 | Kraus et al. | ............... | 365/145 |
| 6,584,009 B1 * | 6/2003 | Roehr et al. | ............... | 365/145 |
| 6,667,896 B2 * | 12/2003 | Rickes et al. | ............... | 365/145 |
| 6,671,199 B2 * | 12/2003 | Maruyama | ................. | 365/145 |
| 6,819,601 B2 * | 11/2004 | Eliason et al. | ............. | 365/145 |
| 6,906,943 B2 * | 6/2005 | Kang | ...................... | 365/145 |
| 6,906,945 B2 * | 6/2005 | Madan | ...................... | 365/145 |
| 6,950,326 B2 * | 9/2005 | Suzuki | ..................... | 365/145 |
| 6,980,460 B2 * | 12/2005 | Shiratake et al. | ......... | 365/145 |
| 7,064,972 B2 * | 6/2006 | Takashima | ................ | 365/145 |

\* cited by examiner

*Primary Examiner*—Trong Phan
(74) *Attorney, Agent, or Firm*—Jacqueline J. Garner; W. James Brady, III; Frederick J. Telecky, Jr.

(57) ABSTRACT

A memory circuit and method to reduce wordline coupling is disclosed. The circuit includes a plurality of memory cells arranged in rows (702, 704, and 706) and columns (750, 752). A first conductor (710, 850) is coupled to a plurality of the rows (702, 704, and 706) of memory cells. A first transistor (810) has a current path coupled between a voltage supply terminal (800) and the first conductor (850) and a control terminal coupled to receive a first control signal (PLV). A second transistor (820) has a current path coupled between the voltage supply terminal and the first conductor and a control terminal coupled to receive a second control signal (PLW).

14 Claims, 5 Drawing Sheets

PLATELINE DRIVER WITH RAMP RATE CONTROL

CLAIM TO PRIORITY OF NONPROVISIONAL APPLICATION

This application is a continuation-in-part of U.S. application Ser. No. 10/614,299, filed Jul. 2, 2003, now U.S. Pat. No. 6,809,954, and claims the benefit under 35 U.S.C. § 120; this application is a continuation-in-part of U.S. application Ser. No. 10/866,834, filed Jun. 14, 2004, now copending, and claims the benefit under 35 U.S.C. § 120.

FIELD OF THE INVENTION

This invention generally relates to electronic circuits, and more specifically to noise reduction in semiconductor integrated circuits.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Many new applications, however, require the access time and packing density of previous generation nonvolatile memories in addition to low power consumption for battery powered circuits. One nonvolatile memory technology that is particularly attractive for these low power applications is the ferroelectric memory cell. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. However, both ferroelectric materials suffer from fatigue and imprint. Fatigue is characterized by a gradual decrease in net stored charge with repeated cycling of a ferroelectric capacitor. Imprint is a tendency to prefer one state over another if the ferroelectric capacitor remains in that state for a long time.

Figure 1:
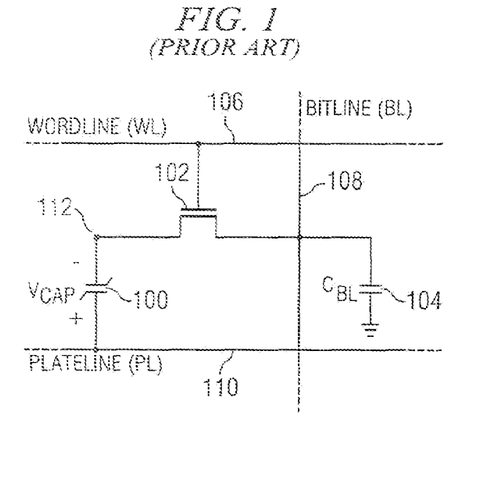
FIG. 1 is a circuit diagram of a ferroelectric memory cell of the prior art.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor (FeCAP) 100 is connected between plateline 110 and storage node 112. Access transistor 102 has a current path connected between bitline 108 and storage node 112. A control gate of access transistor 102 is connected to wordline 106 to control reading and writing of data to the ferroelectric memory cell. This data is stored as a polarized charge corresponding to cell voltage $V_{CAP}$. Parasitic capacitance of bitline BL is represented by capacitor $C_{BL}$ 104.

Figure 2:
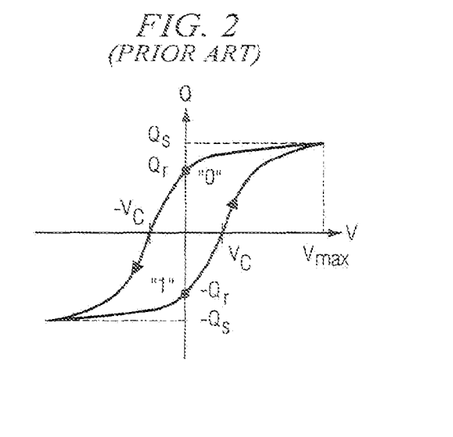
FIG. 2 is a hysteresis curve of the ferroelectric capacitor 100 of FIG. 1.

Referring to FIG. 2, there is a hysteresis curve corresponding to the ferroelectric capacitor 100. The hysteresis curve includes net charge Q or polarization along the vertical axis and voltage along the horizontal axis. By convention, the polarity of cell voltage is defined as shown in FIG. 1. A stored "0", therefore, is characterized by a positive voltage at the plateline terminal with respect to the access transistor terminal. A stored "1" is characterized by a negative voltage at the plateline terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying –Vmax to the ferroelectric capacitor. This charges the linear and switching components of the ferroelectric capacitor to a saturation charge of –Qs. The stored charge reverts to –Qr when the electric field is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed.

Figure 3:
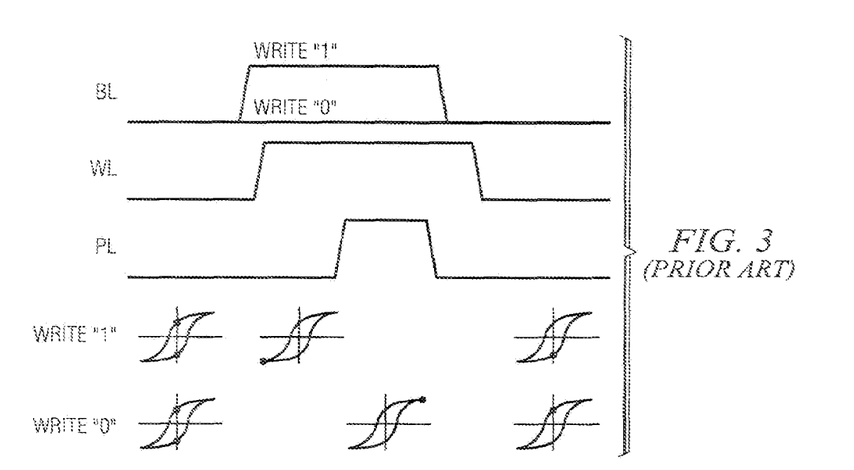
FIG. 3 is a timing diagram showing a write operation to the ferroelectric memory cell of FIG. 1.

Referring to FIG. 3, there is illustrated a typical write sequence for a ferroelectric memory cell as in FIG. 1. Initially, the bitline (BL), wordline (WL), and plateline (PL) are all low. The upper row of hysteresis curves illustrates a write "1" and the lower row represents a write "0". Either a "1" or "0" is initially stored in each exemplary memory cell. The write "1" is performed when the bitline BL and wordline WL are high and the plateline PL is low. This places a negative voltage across the ferroelectric capacitor and charges it to –Qs. When plateline PL goes high, the voltage across the ferroelectric capacitor is 0 V, and the stored charge reverts to –Qr. At the end of the write cycle, both bitline BL and plateline PL go low and stored charge –Qr remains on the ferroelectric capacitor. Alternatively, the write "0" occurs when bitline BL remains low and plateline PL goes high. This places a positive voltage across the ferroelectric capacitor and charges it to Qs representing a stored "1". When plateline PL goes low, the voltage across the ferroelectric capacitor is 0 V, and the stored charge reverts to Qr representing a stored "0".

Figure 4:
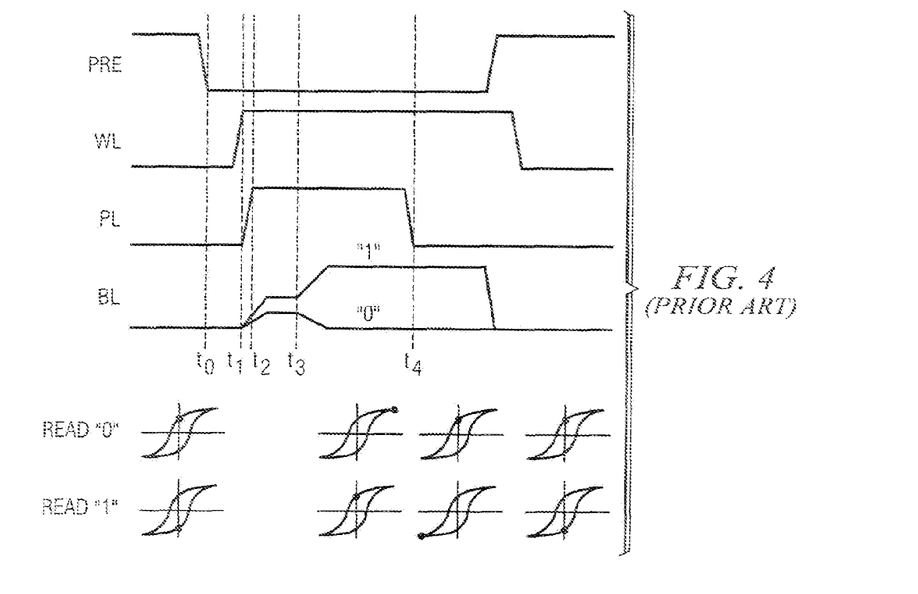
FIG. 4 is a timing diagram of a step sense read operation from the ferroelectric memory cell of FIG. 1.

A step sensing read operation is illustrated at FIG. 4 for the ferroelectric memory cell at FIG. 1. The upper row of hysteresis curves illustrates a read "0". The lower row of hysteresis curves illustrates a read "1". Wordline WL and plateline PL are initially low. Bitlines BL are precharged low. At time $t_0$ precharge signal PRE goes low, permitting the bitlines BL to float. At times $t_1$ and $t_2$ wordline WL and plateline PL go high, respectively, thereby permitting each memory cell connected to the active wordline WL and plateline PL to share charge with a respective bitline. A stored "1" will share more charge with parasitic bitline capacitance $C_{BL}$ and produce a greater bitline voltage than the stored "0" as shown between times $t_2$ and $t_3$. A reference voltage (not shown) is produced at each complementary bitline of an accessed bitline. This reference voltage is between the "1" and "0" voltages at $t_3$. A difference voltage between either a "1" or "0" voltage and a corresponding reference voltage is applied to each respective sense amplifier. The sense amplifiers are activated at time $t_3$ to amplify the difference voltage. When respective bitline voltages are fully amplified after time $t_3$, the read "0" curve cell charge has increased from Qr to Qs. By way of comparison, the read "1" data state has changed from a stored "1" to a stored "0". Thus, the read "0" operation is nondestructive, but the read "1" operation is destructive. At time $t_4$, plateline PL goes low and applies −Vmax to the read "1" cell, thereby storing −Qs. At the same time, zero voltage is applied to the read "0" cell and charge Qr is restored. At the end of the read cycle, signal PRE goes high and precharges both bitlines BL return to zero volts or ground. The wordline goes low, thereby isolating the ferroelectric capacitor from the bitline. Thus, zero volts is applied to the read "1" cell and −Qr is restored.

Figure 5:
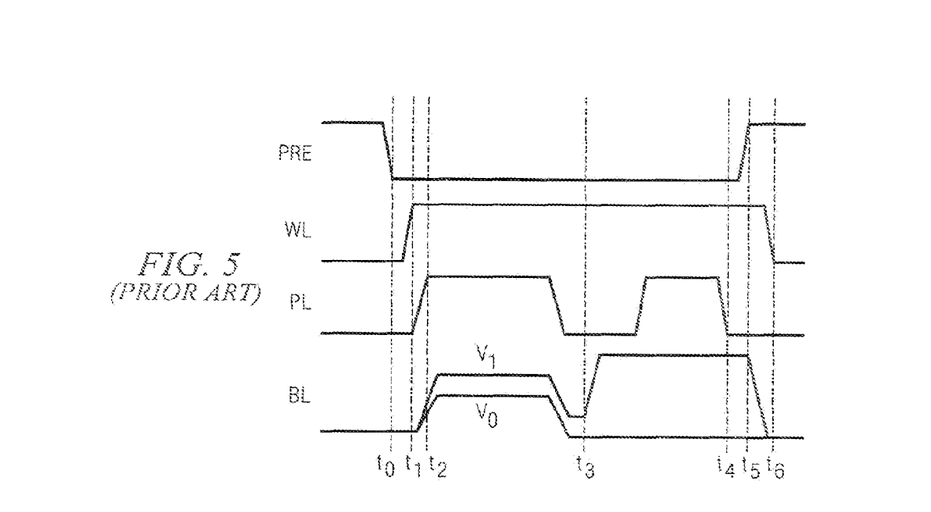
FIG. 5 is a timing diagram of a pulse sense read operation from the ferroelectric memory cell of FIG. 1.

Referring now to FIG. 5, a pulse sensing read operation is illustrated for a ferroelectric memory circuit. The read operation begins at time $t_0$ when precharge signal PRE goes low, permitting the bitlines BL to float. Wordline WL and plateline PL are initially low, and bitlines BL are precharged low. At time $t_1$, wordline WL goes high, thereby coupling a ferroelectric capacitor to a respective bitline. Then plateline PL goes high at time $t_2$, thereby permitting each memory cell to share charge with the respective bitline. The ferroelectric memory cells share charge with their respective bitlines BL and develop respective difference voltages. Here, $V_1$ represents a data "1" and $V_0$ represents a data "0". Plateline PL then goes low prior to time $t_3$, and the common mode difference voltage goes to near zero. The difference voltage available for sensing is the difference between one of $V_1$ and $V_0$ at time $t_3$ and a reference voltage (not shown) which lies approximately midway between voltages $V_1$ and $V_0$ at time $t_3$. The difference voltage is amplified at time $t_3$ by respective sense amplifiers and full bitline BL voltages are developed while the plateline PL is low. Thus, the data "1" cell is fully restored while plateline PL is low and the data "1" bitline BL is high. Subsequently, the plateline PL goes high while the data "0" bitline BL remains low. Thus, the data "0" cell is restored. The plateline PL goes low at time $t_4$, and precharge signal PRE goes high at time $t_5$. The high level of precharge signal PRE precharges the bitlines to ground or Vss. The wordline WL goes low at time $t_6$, thereby isolating the ferroelectric capacitor from the bitline and completing the pulse sensing cycle.

Figure 7:
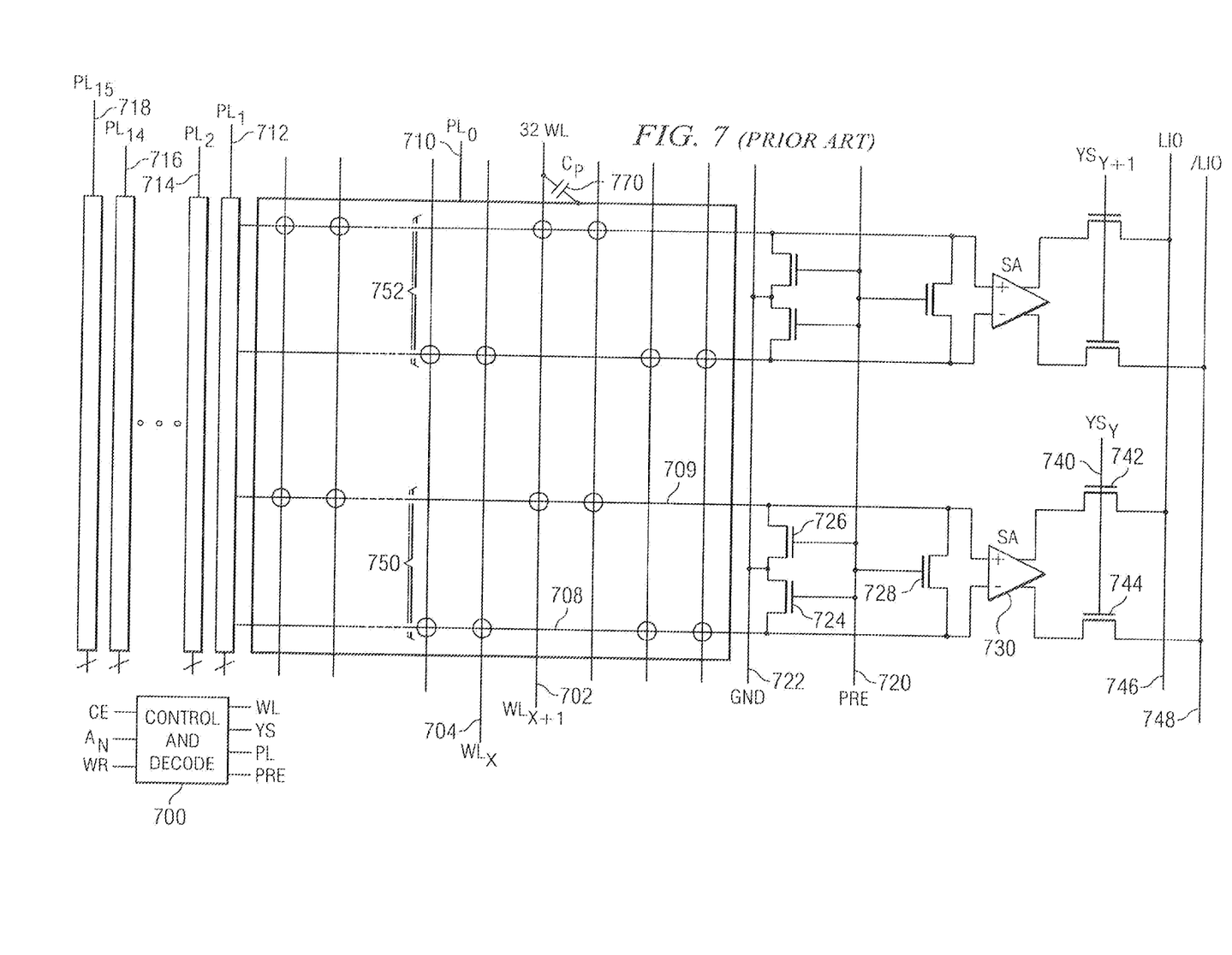
FIG. 7 is a schematic diagram of a prior art memory circuit showing capacitive coupling from a plateline to an unselected wordline.

Referring to FIG. 7, there is a schematic diagram of a ferroelectric memory circuit. Although the memory circuit includes many similar memory arrays, only a portion of the array is shown for clarity. The memory array includes memory cells arranged in rows corresponding to wordlines 702, 704 and columns 750, 752. Individual memory cells are indicated by circles at intersections of rows and columns. The memory circuit includes 16 platelines 710-718. Each plateline is coupled to receive a respective plateline signal $PL_0$-$PL_{15}$. Each plateline, for example plateline 710, is common to 32 rows of memory cells including rows common to wordlines 702-704. Each row of memory cells is selected by an active wordline signal. For example, row 704 is selected by active wordline signal $WL_X$ on wordline 704. Each column includes a bitline 708 and a complementary bitline 709 that form a bitline pair. Each bitline pair is coupled to a respective sense amplifier such as sense amplifier 730. Each sense amplifier has complementary output terminals coupled to local input/output lines LIO 746 and /LIO 748 by column select transistors 742 and 744, respectively. The column select transistors are selected by an active column select signal, for example, $YS_Y$ on lead 740. Each column has a respective precharge circuit including first 724, second 726, and third 728 precharge transistors. The first and second precharge transistors respectively couple the bitline 708 and complementary bitline 709 to voltage terminal GND via lead 722 in response to an active precharge signal PRE on lead 720. A third precharge transistor couples the bitline 708 and complementary bitline 709 to each other in response to the active precharge signal PRE on lead 720.

In operation, the control and decode circuit 700 receives a chip enable signal CE, an address signal $A_N$ including N address bits, and a read/write signal WR. The control and decode circuit produces an active wordline signal $WL_X$, an active column select signal $YS_Y$, an active plateline signal $PL_0$, and a precharge signal PRE, from group signals WL, YS, and PL. A selected memory cell at the intersection of the addressed row and column receives or produces data on a respective bitline in response to a logical state of read/write signal WR. For example, when signal WR is high, a write operation is performed. Alternatively, when signal WR is low, a read operation is performed. For either a read or a write operation, when a plateline signal such as plateline signal $PL_0$ 710 goes active high, a small voltage is coupled to unselected wordlines such as wordline $WL_{X+1}$ 702 through parasitic capacitor 770. This parasitic capacitance exists between each wordline conductor and the respective plateline conductor but is only described for wordline $WL_{X+1}$ 702 for clarity. This capacitive coupling increases the voltage on each unselected wordline such as wordline $WL_{X+1}$ 702 by as much as 200 mV and increases subthreshold leakage by approximately two orders of magnitude. The low-to-high transition of plateline signal $PL_0$ 710 induces subthreshold current to flow from the storage node to the bitline. This charge loss couples as much as −13 mV to the storage node of each memory cell along wordline 702 following a subsequent high-to-low transition of plateline signal $PL_0$ 710. Moreover, the subthreshold current from bitline to storage node of the memory cells on wordline 702 when plateline signal $PL_0$ is low is much less than when high as previously explained. This is because the drain-to-source voltage of each access transistor is much less. Thus, repeated access to rows of memory cells corresponding to plateline $PL_0$ 710 results in accumulated negative voltage of as much as −200 mV at the storage node of each memory cell on wordline 702.

Figure 6:
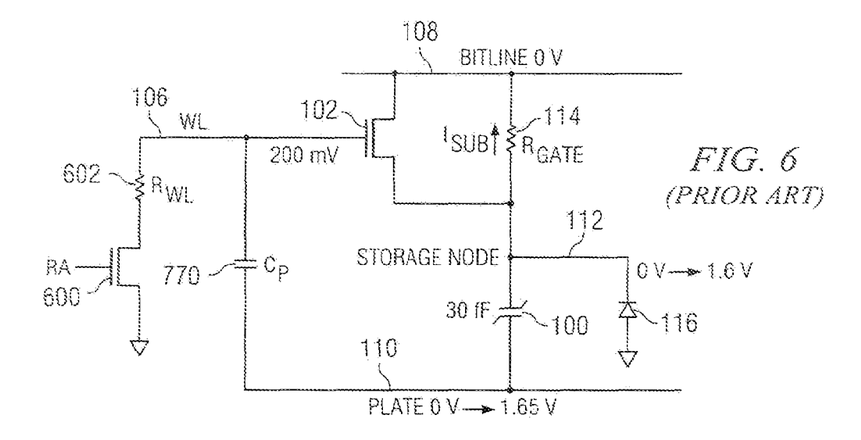
FIG. 6 is a simplified circuit diagram of the prior art showing charge accumulation at the ferroelectric memory cell storage node due to subthreshold leakage.

Turning now to FIG. 6, there is a simplified diagram of an unselected ferroelectric memory cell such as on unselected wordline $WL_{X+1}$ 702 (FIG. 7) illustrating a problem with both step and pulse sensing schemes. Here, the same reference numerals are used as in the memory cell of FIG. 1 to show comparable elements of the ferroelectric memory cell. Resistor $R_{GATE}$ 114 represents subthreshold leakage path of access transistor 102. Diode 116 is a parasitic junction diode between storage node 112 and the memory circuit substrate. The wordline terminal 106 is unselected during a read operation. Resistor $R_{WL}$ 602 represents the parasitic resistance of wordline 106 between the unselected memory cell and the row decode circuit. Resistor $R_{WL}$ 602 preferably includes a polycrystalline silicon wordline in parallel with a metal strap as is known in the art and is generally referred to as a wordline conductor. N-channel transistor 600 is a part of the row decode circuit that is coupled to wordline 106 through parasitic resistance $R_{WL}$ 602. When the memory cell is unselected, row address signal RA remains high, thereby holding wordline 106 to ground. Plateline 110 is common to cells on a selected wordline (not shown) as well as cells on the unselected wordline WL 106. Plateline 110 is a plateline conductor. Thus, wordline terminal 106 may develop 200 mV during a low-to-high transition of the plateline 110, as will be explained in detail. Ferroelectric capacitor 100 stores a respective data signal and preferably has zero volts until a coercive voltage is developed across the terminals as previously explained. For the following exemplary discussion, ferroelectric capacitor 100 has approximately 30 fF capacitance.

During a read or write operation a selected wordline is driven high to approximately 2.2 V. Plateline PL 110 is driven high to approximately 1.65 V, and bitline BL 108 is driven low. The local polycrystalline silicon wordline between contacts of a corresponding metal wordline shunt has a significant resistance $R_{WL}$. Due to this local resistance 602 of wordline WL 106 and the resistance of the row decode pull down transistor 600, the low-to-high transition of plateline PL 110 capacitively couples 200 mV to wordline terminal 106 through parasitic capacitor $C_P$ 770. This increase in gate voltage greatly increases subthreshold conduction of access transistor 102. Due to charge sharing with diode 116 and gate-to-source capacitance of access transistor 102, the plateline PL transition couples 1.6 V to storage node 112. Thus, storage node 112 goes from 0 V to 1.6 V. Under these conditions at high temperature, subthreshold leakage current $I_{SUB}$ of access transistor 102 increases from less than 1 nA when there is no coupling to wordline 106 to approximately 100 nA, or about two orders of magnitude, when 200 mV is coupled to wordline 106. This level of subthreshold leakage current through resistor $R_{GATE}$ 114 lasts for approximately 4 ns until the row decode pull down transistor 600 can restore wordline WL 106 to 0 V. The subthreshold current $I_{SUB}$ of 100 nA for 4 ns, however, represents a 13 mV decrease in storage node voltage subject to the previously described conditions. Moreover, this charge loss is cumulative. Minimal current flows from bitline BL 108 through access transistor 102 when plateline PL 110 returns to 0 V due to the small drain-to-source voltage. Subsequent memory accesses to rows of memory cells common to plateline 110 and resulting charge loss, however, may result in a negative voltage of as much as −200 mV at storage node 112. Such memory accesses would significantly degrade the data "1" level of the ferroelectric memory cell resulting in read errors. This degradation of the data "1" level introduces a bitline voltage imbalance and may even depolarize the ferroelectric capacitor.

SUMMARY OF THE INVENTION

In accordance with a preferred embodiment of the invention, a memory circuit and method to reduce capacitive coupling to unselected wordlines is disclosed. The circuit includes a plurality of memory cells arranged in rows and columns. A first conductor is coupled to a plurality of the rows of memory cells. A first transistor has a current path coupled between a voltage supply terminal and the first conductor and a control terminal coupled to receive a first control signal. A second transistor has a current path coupled between the voltage supply terminal and the first conductor and a control terminal coupled to receive a second control signal. The voltage coupled to each unselected wordline is reduced by selectively activating the first conductor, thereby reducing voltage coupled to unselected wordlines.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 8:
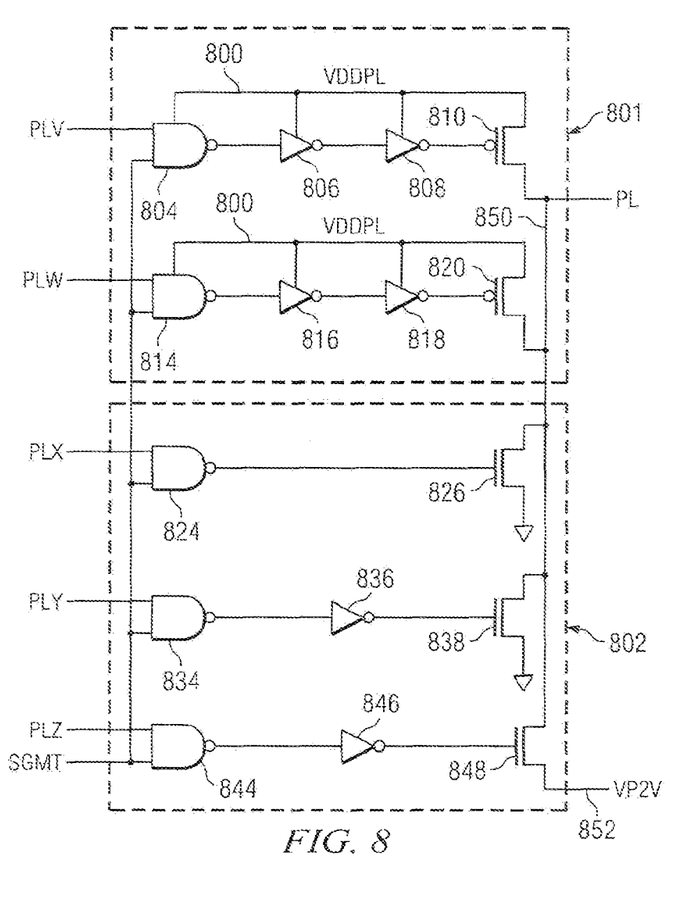
FIG. 8 is a schematic diagram of a plateline drive circuit of the present invention.

Referring to FIG. 8, there is a schematic diagram of a plateline drive circuit of the present invention. The circuit includes a pull up section 801 and a pull down section 802. The pull down section 802 is described in detail in copending application Ser. No. 10/614,299, filed Jul. 2, 2003, and is incorporated by reference herein in its entirety. The first stage includes NAND gate 824 and a relatively small N-channel pull down transistor 826 having a width of preferably 12 µm. The second stage includes NAND gate 834, inverter 836, and a relatively larger N-channel pull down transistor 838 having a width of preferably 64 µm. The pull down section 802 further includes a low voltage bias section comprising NAND gate 844, inverter 846, and N-channel transistor 848. This low voltage bias section couples unselected platelines to voltage supply VP2V on lead 852 during read and write operations and is described in detail in the copending application Ser. No. 10/614,299.

The pull up section 801 includes a two-stage pull up circuit. The first stage includes NAND gate 804, inverters 806 and 808, and a relatively small P-channel pull up transistor 810 preferably having a width of 15 µm. The second stage includes NAND gate 814, inverters 816 and 818, and a relatively larger P-channel pull up transistor 820 preferably having a width of 25 µm. Both pull up section 801 and pull down section 802 are coupled to a respective plateline conductor 850.

Figure 9:
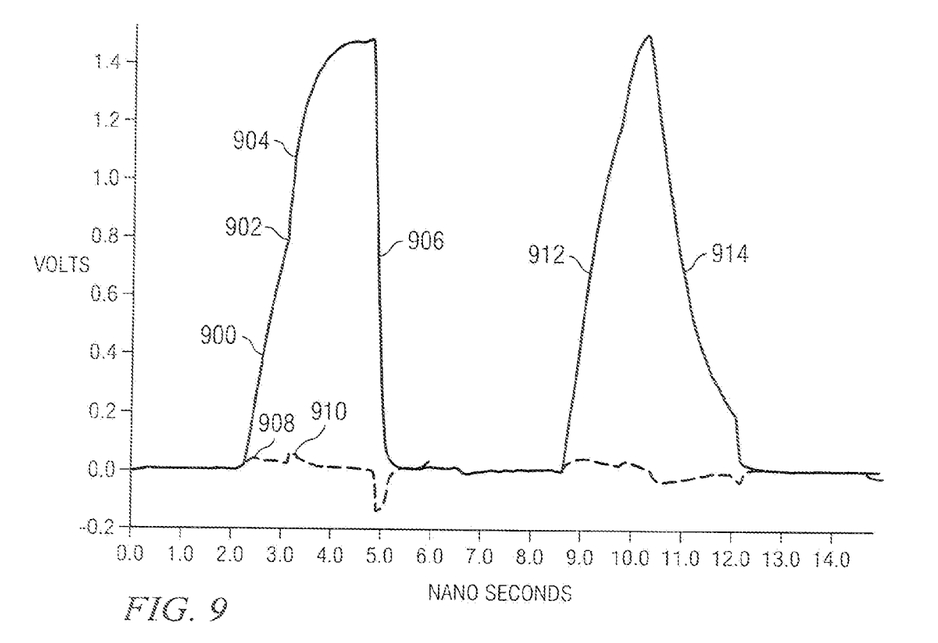
FIG. 9 is a simulated waveform of the circuit of FIG. 8.

Referring now to FIG. 9, there is a simulated plateline waveform of the circuit of FIG. 8 for a pulse sensing ferroelectric memory together with an unselected wordline waveform. Operation of the plateline drive circuit of FIG. 8 will now be described in detail with reference to the waveforms of FIG. 9. During normal operation, current flows through a parasitic capacitance to each unselected wordline of the ferroelectric memory from a respective active plateline conductor. This current is a product of plateline-to-wordline capacitance and a rate of change of voltage of the plateline with respect to time. The circuit of FIG. 8 advantageously reduces this current flow by reducing the rate of change of plateline voltage with respect to time.

In operation, control signals PLV and PLW are initially low so that P-channel transistors 810 and 820 are off. Control signals PLX and PLY are initially low so that N-channel transistors 826 and 838 are on and off, respectively. Plateline signal PL at lead 850, therefore, is initially low. Control signal PLZ is initially low and remains low for a selected plateline so that N-channel transistor 848 remains off. Segment address SGMT is applied to selectively enable the plateline drive circuit. Control signal PLX goes high, thereby turning off N-channel transistor 826. Control signal PLV goes high at 2 ns simulation time and produces a low level output from NAND gate 804. This low level output is buffered by inverters 806 and 808 to produce a low output signal that turns on P-channel transistor 810. In response, P-channel transistor produces a plateline drive signal PL with a relatively slow rate of change of voltage with respect to time 900. This relatively slow rate of change of voltage with respect to time advantageously limits current flow through the parasitic capacitance between the plateline and the unselected wordlines. A maximum voltage of 56 mV is coupled to the unselected wordline 908. After a brief delay, control signal PLW goes high and turns on P-channel transistor 820 through inverters 816 and 818. The parallel combination of P-channel transistors 810 and 820 produces a discontinuity 902 in the rising edge of signal PL and an increased rate of change of voltage with respect to time 904. The increased rate of change of voltage with respect to time produces a maximum voltage of 82 mV on the unselected wordline 910, since plateline signal PL is near VDDPL. When control signal PL reaches a maximum value, ferroelectric memory cells on a selected wordline have fully shared charge with their respective bitlines. Control signals PLV and PLW go low, thereby turning off P-channel transistors 810 and 820.

Next control signals PLX and PLY go low and high, respectively to turn on N-channel transistors 826 and 838. The parallel combination of both transistors produces a short fall time 906 of plateline signal PL. A low level of plateline signal PL at 5 ns simulation time provides a greater time to restore ferroelectric memory cells to a true one state. At 8.5 ns of simulation time, control signals PLX and PLY go high and low, respectively, thereby turning off N-channel transistors 826 and 838. Control signal PLV returns to a high level but control signal PLW remains low. Thus, P-channel transistor 810 is on and P-channel transistor 820 is off. This produces a relatively slow rise time 912 of plateline signal PL. This relatively slow rise time is possible since plateline signal PL does not need to completely reach a VDDPL level to restore memory cells with a true zero. Thus, the relatively slow rise time advantageously reduces coupling to unselected wordlines to less than 40 mV. In fact, the rise time 912 may be slightly less than the rise time 900 even though P-channel transistor 810 produces both rising edges. This is because the wordline 106 (FIG. 6) is at a higher level during the second plateline pulse, so storage nodes 112 of selected cells more readily conduct to respective bitlines 108, thereby increasing the load on plateline 110. At 10 ns simulation time, control signal PLV goes low and P-channel transistor 810 turns off. Control signal PLX then goes low and control signal PLY remains low. Only N-channel transistor 826, therefore, is activated to produce a relatively slow fall time 914. The present invention advantageously reduces capacitive coupling to adjacent conductors, thereby reducing array noise in the ferroelectric memory. Advantages of the present invention, therefore, are equally applicable to single-pulse step sensing schemes.

Figure 10:
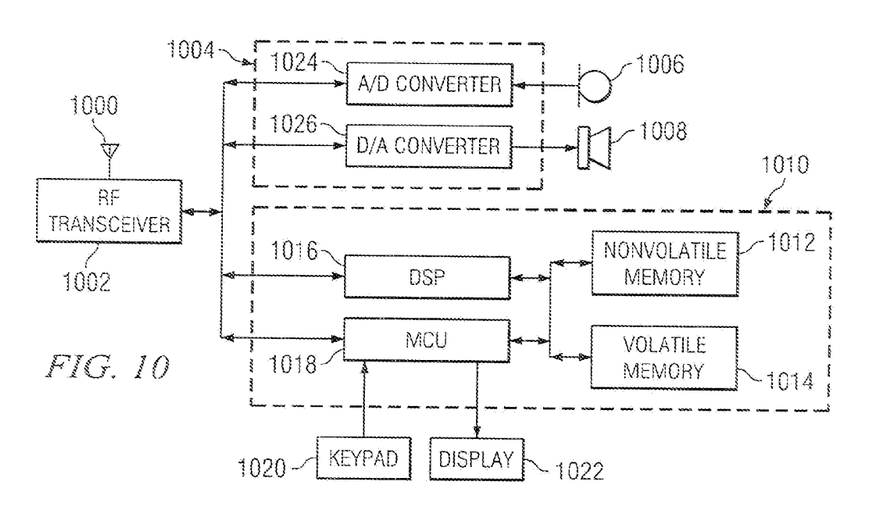
FIG. 10 is a block diagram of a wireless telephone as an example of a portable electronic device which could advantageously employ the present invention.

Referring to FIG. 10, there is a block diagram of a wireless telephone as an example of a portable electronic device which could advantageously employ this invention in memory arrays, decode circuits, interconnect cells, or any other geometrical array as is known in the art. The wireless telephone includes antenna 1000, radio frequency transceiver 1002, baseband circuits 1010, microphone 1006, speaker 1008, keypad 1020, and display 1022. The wireless telephone is preferably powered by a rechargeable battery (not shown) as is well known in the art. Antenna 1000 permits the wireless telephone to interact with the radio frequency environment for wireless telephony in a manner known in the art. Radio frequency transceiver 1002 both transmits and receives radio frequency signals via antenna 1000. The transmitted signals are modulated by the voice/data output signals received from baseband circuits 1010. The received signals are demodulated and supplied to baseband circuits 1010 as voice/data input signals. An analog section 1004 includes an analog to digital converter 1024 connected to microphone 1006 to receive analog voice signals. The analog to digital converter 1024 converts these analog voice signals to digital data and applies them to digital signal processor 1016. Analog section 1004 also includes a digital to analog converter 1026 connected to speaker 1008. Speaker 1008 provides the voice output to the user. Digital section 1010 is embodied in one or more integrated circuits and includes a microcontroller unit 1018, a digital signal processor 1016, nonvolatile memory circuit 1012, and volatile memory circuit 1014. Nonvolatile memory circuit 1012 may include read only memory (ROM), ferroelectric memory (FeRAM), FLASH memory, or other nonvolatile memory as known in the art. Volatile memory circuit 1014 may include dynamic random access memory (DRAM), static random access memory (SRAM), or other volatile memory circuits as known in the art. Microcontroller unit 1018 interacts with keypad 1020 to receive telephone number inputs and control inputs from the user. Microcontroller unit 1018 supplies the drive function to display 1022 to display numbers dialed, the current state of the telephone such as battery life remaining, and received alphanumeric messages. Digital signal processor 1016 provides real time signal processing for transmit encoding, receive decoding, error detection and correction, echo cancellation, voice band filtering, etc. Both microcontroller unit 1018 and digital signal processor 1016 interface with nonvolatile memory circuit 1012 for program instructions and user profile data. Microcontroller unit 1018 and digital signal processor 1016 also interface with volatile memory circuit 1014 for signal processing, voice recognition processing, and other applications.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, a preferred embodiment of the present invention has been described with respect to a one-transistor/one-capacitor (1T/1C) ferroelectric memory cell. The present invention is equally applicable to two-transistor/two-capacitor (2T/2C) ferroelectric or dynamic random access memory cells. These 2T/2C cells are complementary 1T/1C memory cells. A wordline (or wordlines) activates the 2T/2C memory cell, thereby coupling the complementary 1T/1C memory cells to their respective complementary bitlines. If the 2T/2C memory cell stores a data "1", for example, the true and complementary bitline voltages change to produce a total difference voltage. Moreover, the present invention is equally applicable to adjacent conductors of a one-transistor/one-capacitor (1T/1C) dynamic random access memory cell, a static random access memory (SRAM) cell, or other memory cell as known in the art. It is therefore intended that the appended claims encompass any such modifications or embodiments.

What is claimed is:

1. A memory circuit, comprising:
a plurality of memory cells arranged in rows and columns;
a first conductor coupled to a plurality of the rows of memory cells;
a first transistor having a current path coupled between a voltage supply terminal and the first conductor and having a control terminal coupled to receive a first control signal;
a second transistor having a current path coupled between the voltage supply terminal and the first conductor and having a control terminal coupled to receive a second control signal;
a reference voltage terminal;
a third transistor having a current path coupled between the first conductor and the reference voltage terminal and having a control terminal coupled to receive a third control signal, said third control signal being distinct from said first and second control signals;
a low voltage supply terminal; and
a fourth transistor having a current path coupled between the first conductor and the low voltage supply terminal and having a control terminal coupled to receive a fourth control signal, said fourth control signal being distinct from said first, second, and third control signals.

2. A memory circuit as in claim 1, wherein each of the rows of memory cells comprises a wordline coupled to a respective row of memory cells.

3. A memory circuit as in claim 2, wherein each memory cell is a nonvolatile memory cell.

4. A memory circuit as in claim 2, wherein the first conductor is a plateline conductor.

5. A memory circuit as in claim 4, wherein each said memory cell comprises Lead Zirconate Titanate (PZT).

6. A memory circuit as in claim 4, wherein each said memory cell comprises Strontium Bismuth Titanate (SBT).

7. A memory circuit as in claim 1, wherein each of the first and second transistors is a P-channel transistor.

8. A memory circuit as in claim 1, comprising:
a fifth transistor having a current path coupled between the first conductor and the reference voltage terminal and having a control terminal coupled to receive a fifth control signal.

9. A portable electronic device, comprising:
a processor circuit; and
a memory circuit coupled to the processor circuit, the memory circuit comprising:
a plurality of memory cells arranged in rows and columns;
a first conductor coupled to a plurality of the rows of memory cells;
a first transistor having a current path coupled between a voltage supply terminal and the first conductor and having a control terminal coupled to receive a first control signal;
a second transistor having a current path coupled between the voltage supply terminal and the first conductor and having a control terminal coupled to receive a second control signal;
a reference voltage terminal;
a third transistor having a current path coupled between the first conductor and the reference voltage terminal and having a control terminal coupled to receive a third control signal;
a low voltage supply terminal; and
a fourth transistor having a current path coupled between the first conductor and the low voltage supply terminal and having a control terminal coupled to receive a fourth control signal, wherein the reference terminal is a ground terminal and wherein voltage supply terminal is coupled to receive a voltage that is positive with respect to a voltage at the ground terminal.

10. A portable electronic device as in claim 9, wherein each of the rows of memory cells comprises a wordline coupled to a respective row of memory cells.

11. A portable electronic device as in claim 10, wherein each of the first and second transistors is a P-channel transistor.

12. A portable electronic device as in claim 10, wherein each memory cell is a nonvolatile memory cell.

13. A portable electronic device as in claim 10, wherein the first conductor is a plateline conductor.

14. A portable electronic device as in claim 9, comprising a fifth transistor having a current path coupled between the first conductor and the reference voltage terminal and having a control terminal coupled to receive a fifth control signal.

* * * * *